United States Patent [19]
Fuchs

[11] Patent Number: 5,367,267
[45] Date of Patent: Nov. 22, 1994

[54] BROADBAND AMPLIFIER HAVING INDIVIDUAL INPUT CIRCUITS WITH PLURALITIES OF CAPACITORS AND RESISTORS

[75] Inventor: Hans-Peter Fuchs, Kirchheim, Germany

[73] Assignee: Rohde & Schwarz GmbH & Co., KG, Munich, Germany

[21] Appl. No.: 43,811

[22] Filed: Apr. 7, 1993

[30] Foreign Application Priority Data

Apr. 23, 1992 [DE] Germany ............................ 4213357

[51] Int. Cl.⁵ ........................................... H03F 3/60
[52] U.S. Cl. ................................... 330/54; 330/286; 330/295
[58] Field of Search .................... 330/53, 54, 277, 286, 330/295

[56] References Cited

U.S. PATENT DOCUMENTS 5,028,879  7/1991  Kim .......................................... 330/54

OTHER PUBLICATIONS

Texas Instruments TGA8334-SCC 2-TO20-GHz Power Amplifier, data sheets, Jul. 1990, pp. 1-7, & 14.
A-120 GHz Dual Gate Distributed Power Amplifier, Halladay et al., 1987, IEEE GaAs IC Symposium, pp. 219-222.

Primary Examiner—Steven Mottola
Attorney, Agent, or Firm—Hill, Steadman & Simpson

[57] ABSTRACT

In a broadband amplifier having an upper limit frequency of several GHz that is composed of a plurality of transistors connected in parallel, the control terminals (gates) of the transistors are respectively connected to line sections of an input line via an input circuit composed of a plurality of capacitors and appertaining resistors connected in parallel. Outputs (drain terminals) of the transistors are respectively connected to line sections of an output line.

7 Claims, 1 Drawing Sheet

5,367,267

BROADBAND AMPLIFIER HAVING INDIVIDUAL INPUT CIRCUITS WITH PLURALITIES OF CAPACITORS AND RESISTORS

BACKGROUND OF THE INVENTION

The invention is directed to a broadband amplifier having an upper limit frequency of several GHz.

Broadband amplifiers of this type are known as distributed amplifiers (Texas Instruments TGA8334-SCC 2-TO20-GHz Power Amplifier, data sheet 1990 or Halladay, Pavio, Crabill "A 1–20 GHz dual gate distributed power amplifier" 1987, IEEE GaAs IC Symposium, page 219). It is also known to provide an input circuit between the gate terminal of each of the transistors that are connected in parallel and the input line, the input circuit being a parallel circuit of a capacitor and an ohmic resistor. Although the power distribution onto the control inputs of the transistors connected in parallel is thereby somewhat improved, an actually uniform distribution for all frequencies cannot be achieved with this known circuit. In the known circuit, the capacitors are dimensioned such that the capacitances increase continuously from the beginning of the input line at the successive transistors up to the end of the input line, so that the transistors lying farther back receive a comparatively higher frequency part of the input power that is already considerably reduced by losses given the high frequencies. The values of the resistors connected in parallel to the capacitors, however, can only be varied within a narrow range in this known circuit. On the one hand, the resistors must be so small that the gate currents of the transistors do not lead to different operating points; on the other hand, they must be large enough so that they do not cancel the effect of the capacitances at high frequencies.

SUMMARY OF THE INVENTION

It is an object of the present invention to provide a broadband amplifier (distributed amplifier) that enables a nearly complete, uniform distribution of the input power onto the individual transistors, namely for all frequencies in the operating range.

The object of the present invention is achieved by a broadband amplifier having an upper limit frequency of several GHz and composed of a plurality of transistors connected in parallel. Control terminals (gates) of the plurality of transistors are respectively connected via an input circuit to the line sections of an input line. Outputs (drain terminals) are respectively connected to the line sections of an output line. Every input circuit is composed of a plurality of capacitors operatively connected in parallel with respective resistors.

Due to the division of the input circuit allocated to each individual transistor before the gate terminal into two or more capacitors and resistors connected in parallel, the number of degrees of freedom for the dimensioning of the circuit is increased, so that the capacitances for the two or more capacitors and the relationship of the at least two ohmic resistors respectively connected in parallel thereto can be arbitrarily varied for every transistor in the dimensioning. Given n successive transistors connected in parallel, three n degrees of freedom thus derive compared to only n degrees of freedom in the known circuit of the type initially cited.

There are various possibilities for a parallel circuit of at least two capacitors with respectively at least two allocated resistors. The simplest circuit (with respect to the dimensioning as well) is an input circuit composed of the parallel circuit of a resistor and of an appertaining capacitor, connected in series with a further parallel circuit of a resistor and of a capacitor.

The principle of the present invention is suitable both for broadband amplifiers that are constructed with bipolar or with field effect transistors, and with transistors that have only a single gate terminal given field effect transistors or with transistors having two gate terminals (single-gate or dual-gate distributed amplifiers).

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENT

Figure 1:
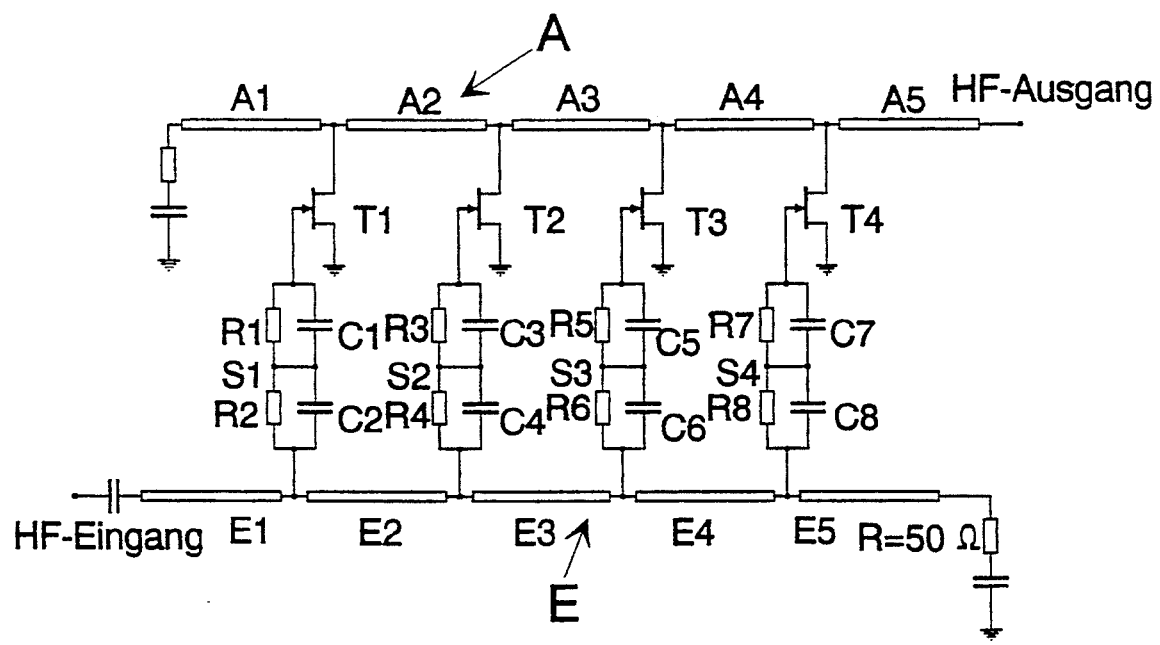
FIG. 1 is a circuit diagram of a broadband amplifier composed of a parallel circuit of a plurality of field effect transistors according to the present invention.

FIG. 1 shows a schematic circuit diagram of a broadband amplifier composed of the parallel circuit of a plurality of field effect transistors. A plurality of four field effect transistors T1 through T4 in the illustrated exemplary embodiment have their gate terminals respectively connected via an input circuit, S1 through S4, constructed of resistors and capacitors, to an input line E that is composed of individual, series-connected line sections E1 through E5. The drain terminals of the transistors T1 through T4 are directly connected to an output line A that is also composed of a plurality of series-connected line sections A1 through A4. The source terminals of the individual transistors are respectively connected to ground or a reference potential.

Figure 2:
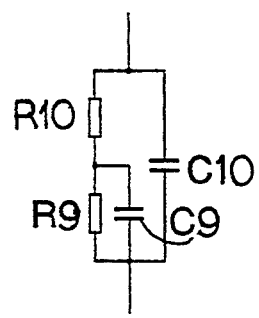
FIG. 2 schematically shows another possibility for the parallel connection of a plurality of resistors and a plurality of capacitors for use in the FIG. 1 circuit.

Each of the individual input circuits S1 through S4 are composed of at least two resistors and capacitors connected in parallel. Two circuit elements, each of which is respectively composed of the parallel circuit of a resistor R1 and a capacitor C1 or of a resistor R2 and a capacitor C2, are connected in series in the exemplary embodiment illustrated in FIG. 1. The following input circuits S2, S3 and S4 are constructed of additional resistors R3 through R8 and capacitors C3 through C8 in the same way. FIG. 2 schematically depicts another possibility for the parallel connection of a plurality of resistors and a plurality of capacitors. In FIG. 2 resistor R9 is connected in parallel with capacitor C9 forming a parallel circuit that is connected in series with resistor R10. Capacitor C10 is connected in parallel to the series connection of resistors R9 and R10.

Constructing the input circuits S1 through S4 of a respective plurality of resistors and capacitors has the advantage that more degrees of freedom are available for the dimensioning of the circuit and, thus, a nearly completely uniform division of the input power onto the inputs of the successive transistors can be achieved. The dimensioning of the circuit ensues in a known way via a development system having a simulator and a circuit optimizer. In this development system, the circuit diagram of, for example, FIG. 1 is first prescribed. Moreover, the optimization goals are prescribed, for example, a gain of respectively more than 7 dB for an amplifier from 2 through 20 GHz. In a known way, the simulator then calculates the properties of the input circuit and an appertaining error function that reflects the degree of deviation from the optimization goals. Subsequently, the values of the quantity enabled for the optimization plus the line length and line width of the line section E1 through E5 or A1 through A4, the resistors R1 through R8 and the appertaining capacitances C1 through C8 are varied until the error function is minimum. To that end, for example, the initial values for the resistors R1 through R8 are input as being of the same size and the values for the capacitors are introduced as continuously increasing values from the first transistor T1 up to the last transistor T4. These prescribed values are then optimized in the circuit optimizer to those values that yield a minimum error function. Since significantly more degrees of freedom are available for the dimensioning of the circuit in the circuit of the invention, it is possible to make the gate voltages at all transistors exactly the same by optimizing these components of the input circuit.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A broadband amplifier having an upper limit frequency of several GHz, comprising: a plurality of transistors connected in parallel and having control terminals connected via an input circuitry to line sections of an input line, said input circuitry having a plurality of individual input circuits, and said plurality of transistors having outputs connected to line sections of an output line; each individual input circuit being composed of a plurality of capacitors operatively connected in parallel with a plurality of resistors that form a plurality of interconnected resistor-capacitor circuits.

2. A broadband amplifier having an upper limit frequency of several GHz, and connected to an input line and an output line, comprising:
    a plurality of transistors connected in parallel, each transistor of said plurality of transistors having a control terminal and first and second terminals, said first terminal being operatively connected to the output line and said second terminals being operatively connected to a reference potential;
    input circuitry operatively connecting each of said control terminals of said plurality of transistors to the input line, said input circuitry having a plurality of individual input circuits respectively connecting said control terminals to said input line, each of said plurality of individual input circuits having a first resistor connected in series with a second resistor, a first capacitor connected in parallel with said first resistor and a second capacitor connected in parallel with said second resistor;
    wherein said first terminals are operatively connected to respective line segments of the output line and said control terminals are connected via said input circuitry to respective line segments of the input line.

3. A broadband amplifier having an upper limit frequency of several GHz, and connected to an input line and an output line, comprising:
    a plurality of transistors connected in parallel, each transistor of said plurality of transistors having a control terminal and first and second terminals, said first terminal being operatively connected to the output line and said second terminals being operatively connected to a reference potential;
    input circuitry operatively connecting each of said control terminals of said plurality of transistors to the input line, said input circuitry having a plurality of individual input circuits respectively connecting said control terminals to said input line, each of said plurality of individual input circuits having a first resistor connected in series with a second resistor, a first capacitor connected in parallel to said series connection of said first and second resistors and a second capacitor connected in parallel to said second resistor;
    wherein said first terminals are operatively connected to respective line segments of the output line and said control terminals are connected via said input circuitry to respective line segments of the input line.

4. A broadband amplifier having an upper limit frequency of several GHz, and connected to an input line and an output line, comprising:
    a plurality of transistors connected in parallel, each transistor of said plurality of transistors having a control terminal and first and second terminals, said first terminal being operatively connected to the output line and said second terminals being operatively connected to a reference potential;
    input circuitry operatively connecting each of said control terminals of said plurality of transistors to the input line, said input circuitry having a plurality of resistors and capacitors;
    said input circuitry having a plurality of individual input circuits respectively connecting said control terminals to said input line;
    each of said plurality of individual input circuits having at least two resistors operatively connected in parallel to at least two comparators; and
    wherein said first terminals are operatively connected to respective line segments of the output line and said control terminals are connected via said input circuitry to respective line segments of the input line.

5. A broadband amplifier having an upper limit frequency of several GHz, and connected to an input line and an output line, comprising:
    a plurality of transistors connected in parallel, each transistor of said plurality of transistors having a control terminal and first and second terminals, said first terminal being operatively connected to the output line and said second terminals being operatively connected to a reference potential;
    input circuitry operatively connecting each of said control terminals of said plurality of transistors to the input line, said input circuitry having a plurality of individual input circuits respectively connecting said control terminals to said input line and each of said plurality of individual input circuits having at least two resistors operatively connected in parallel to at least two capacitors that forms a plurality of interconnected resistor-capacitor circuits;

wherein said first terminals are operatively connected to respective line segments of the output line sand said control terminals are connected via said input circuitry to respective line segments of the input line.

6. The broadband amplifier according to claim 5, wherein each of said plurality of individual input circuits has a first resistor connected in series with a second resistor, a first capacitor connected in parallel with said first resistor and a second capacitor connected in parallel with said second resistor.

7. The broadband amplifier according to claim 5, wherein each of said plurality of individual input circuits has a first resistor connected in series with a second resistor, a first capacitor connected in parallel to said series connection of said first and second resistors and a second capacitor connected in parallel to said second resistor.

* * * * *